United States Patent
Gavardoni et al.

(10) Patent No.: US 7,254,203 B2
(45) Date of Patent: Aug. 7, 2007

(54) METHOD AND APPARATUS FOR USE OF HIGH SAMPLING FREQUENCY A/D CONVERTERS FOR LOW FREQUENCY SAMPLING

(75) Inventors: Maurizio Gavardoni, San Jose, CA (US); Paolo Dalla Ricca, Fremont, CA (US)

(73) Assignee: Credence Systems Corporation, Milpitas, CA (US)

( * ) Notice: Subject to any disclaimer, the term of this patent is extended or adjusted under 35 U.S.C. 154(b) by 630 days.

(21) Appl. No.: 10/267,927

(22) Filed: Oct. 8, 2002

(65) Prior Publication Data

US 2004/0066868 A1    Apr. 8, 2004

(51) Int. Cl.
*H04L 7/00* (2006.01)
(52) U.S. Cl. ...................... 375/355; 327/292
(58) Field of Classification Search ............... 375/354, 375/355, 346, 359, 371, 373, 376, 357; 370/537; 455/343.2; 327/291, 292
See application file for complete search history.

(56) References Cited

U.S. PATENT DOCUMENTS

| | | | | |
|---|---|---|---|---|
| 3,825,844 | A * | 7/1974 | Peterman et al. | 375/342 |
| 4,584,693 | A * | 4/1986 | Levy et al. | 375/281 |
| 5,761,254 | A * | 6/1998 | Behrin | 375/355 |
| 6,529,530 | B1 * | 3/2003 | Ichii et al. | 370/537 |
| 6,807,408 | B2 * | 10/2004 | Lindlar | 455/343.2 |
| 6,859,387 | B1 * | 2/2005 | Aude et al. | 365/155 |
| 2002/0067787 | A1 * | 6/2002 | Naven et al. | 375/359 |
| 2002/0176526 | A1 * | 11/2002 | Mejia | 375/372 |
| 2003/0123597 | A1 * | 7/2003 | Cho | 375/376 |
| 2003/0185329 | A1 * | 10/2003 | Dickmann | 375/375 |
| 2004/0190656 | A1 * | 9/2004 | Taira | 375/346 |

\* cited by examiner

*Primary Examiner*—Jean B. Corrielus (57) ABSTRACT

A method and apparatus for adding fill-in clock pulses to an analog to digital converters input clock signal between requests for analog data acquisition. The circuit that provides the fill-in clock pulses is able to detect a request for analog data acquisition, synchronously stop adding fill-in clock pulses, and track the request for data acquisition.

28 Claims, 8 Drawing Sheets

METHOD AND APPARATUS FOR USE OF HIGH SAMPLING FREQUENCY A/D CONVERTERS FOR LOW FREQUENCY SAMPLING

BACKGROUND

1. Field of the Invention

The present invention relates to analog to digital conversion.

2. Description of Related Art

In order to test semiconductor (IC) devices of the type used in DVD, set-top boxes and game controllers, HDTV, xDSL and cellular baseband applications, high-performance digital and analog capabilities are required.

In particular, these applications require analog to digital (A/D) converters with a very high sample rate, on the order of 80 Msps(mega samples per second), high resolution such as 14–16 digital output bits and high input bandwidth, above 100 MHz.

In these applications, some popular techniques such as successive approximation analog to digital converters, sigma-delta and flash converters are no longer appropriate.

Sigma-delta technique is used for very high resolution A/D converters such as 20–24 bits, but with very low sampling rate in the order of few ksps. This technique is based on the concept of oversampling with a high factor rate and then decimating to obtain extremely low noise and thus a high number of bits. However, this technique cannot be used in applications requiring sampling rates on the order of several tens of Msps.

Successive approximation A/D converters require a relatively long time for the conversation. Flash A/D converters are relatively fast, but generally low resolution (no more than 10 bits). Therefore both of these techniques are not well suited for the above mentioned applications.

Pipeline converters are better for the aforementioned applications. Today's state-of-the-art pipeline converter technology can provide spurious free dynamic range (SFDR) on the order of 100 dB, very high input bandwidth on the order of a few hundreds of MHz and a sampling frequency of up to 100 Msps.

A problem of pipeline converters, though, is their minimum sampling frequency requirement. A general rule of thumb for these converters is that the minimum sampling frequency is on the order of about one tenth of their maximum sampling frequency. Therefore, for high speed pipeline converters in the range of 80 Msps, a minimum sampling frequency requirement between 1 and 10 Msps should be expected. This may not be a problem in applications where the sampling frequency is not required to vary beyond a relatively limited range, but is a limitation in many automated test equipment (ATE) applications.

Thus, a need has developed for a high speed, high resolution analog to digital conversion system that allows for low speed sampling of data as well.

In order to increase the cost benefit of the investment made in this technology, test engineers want use these pipeline analog to digital converters to test a wider range of semiconductor (IC) devices and in several kinds of applications, such as either linearity testing of D/A converters or testing with an undersampling technique. This latter technique requires analog to digital converters with high bandwidth and high performance, but with relatively low sampling frequency. Linearity testing of D/A converters instead may imply that the A/D converter would receive trains of pulses separated by no operation intervals; overall, the A/D converter would receive a non periodic pattern of samples.

Therefore, for certain applications where a pipeline A/D converter is used in ATE, a system that allows the A/D converter to function when the samples are at a rate below its nominal minimum sampling frequency is needed.

SUMMARY

The present invention method and apparatus add fill-in clock pulses to the analog to digital converter's input clock signal between requests for analog data acquisition. The request for analog data acquisition may come as an input clock signal. The circuit that generates these fill-in clock pulses is designed to be able to detect a request for an analog data acquisition, synchronously stop adding the fill-in clock pulses, and track the request for data acquisition.

DETAILED DESCRIPTION

As already mentioned, the pipeline technique in analog to digital converters allows for high speed and high performance. It is a practical solution that is used in state-of-the-art high speed A/D converters.

Figure 1:
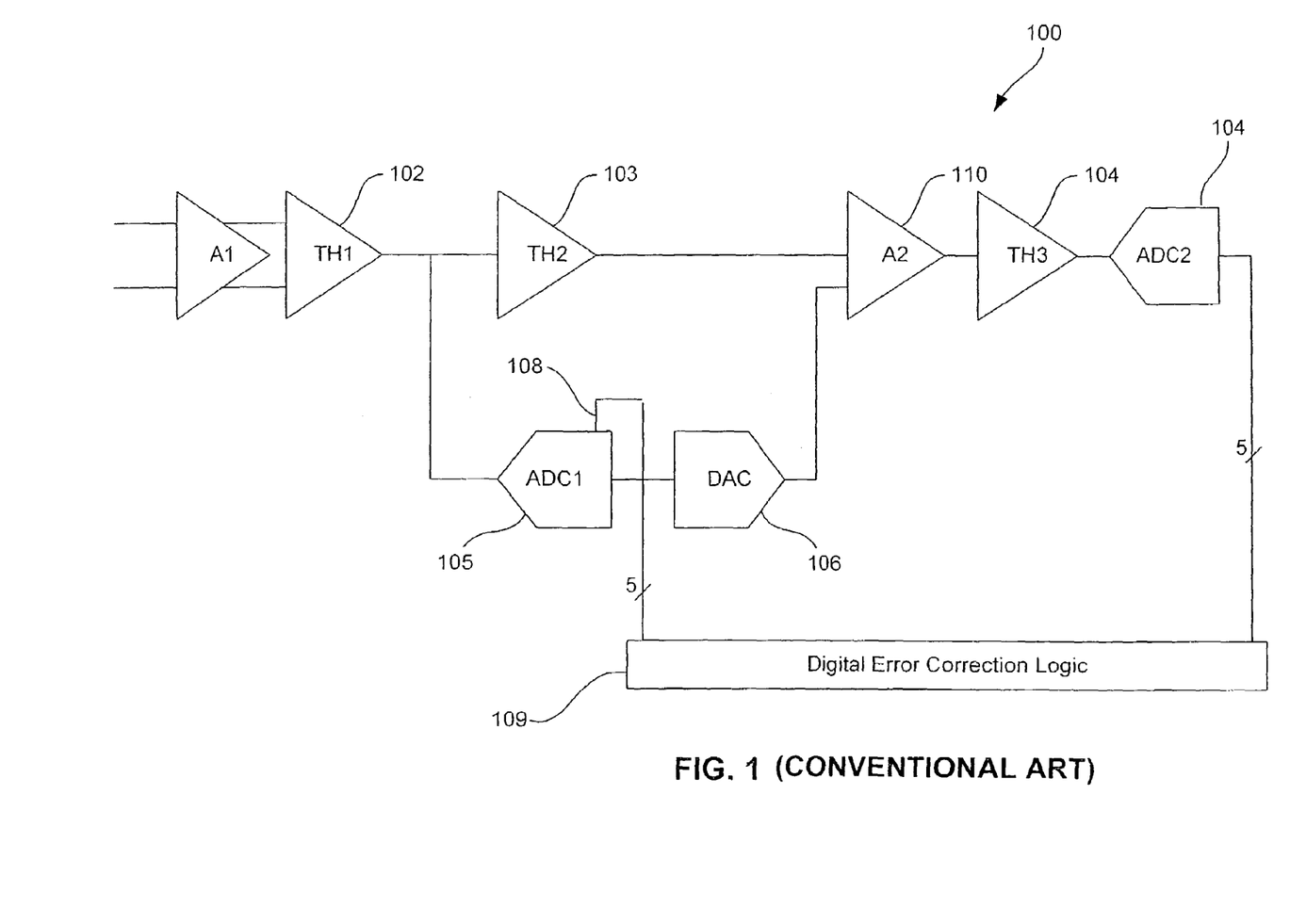
FIG. 1 is a block diagram of a conventional 10 bit A/D converter pipeline structure

A conventional 10 bit A/D converter 100 is shown FIG. 1. The analog signal is sampled by the first track-and-hold circuit (TH1) 102 and coupled to a coarse 5 bit A/D converter 105. The output signal on line 108 of this ADC drives a 10 bit high precision D/A converter 106 and is also coupled to a track and hold circuit (TH2) 103. The output signal of d/A converter 106 is subtracted from the delayed analog signal at differential amplifier 110 which provides the input signal to track and hold circuit (TH3) 104. This generates the residue signal that is sampled by (TH3) 104 and then finally digitized by analog to digital converter (ADC2) 107. Circuit 103 provides an analog "pipeline" delay to compensate for the digital delay of analog to digital converter (ADC1) 108. The final A/D converter (ADC2) 107 is higher precision than ADC1 105. Both A/D converters 105, 107 are coupled to digital error correction logic 109.

In the example of FIG. 1 the overall number of pipes is 3, as demonstrated by the number of track and hold circuits. A minimum sampling frequency is required in order to prevent significant "droop" on the track-and-hold circuits. This droop may be significant because of the low capacitance of the track and hold circuits to achieve high bandwidth.

Figure 2:
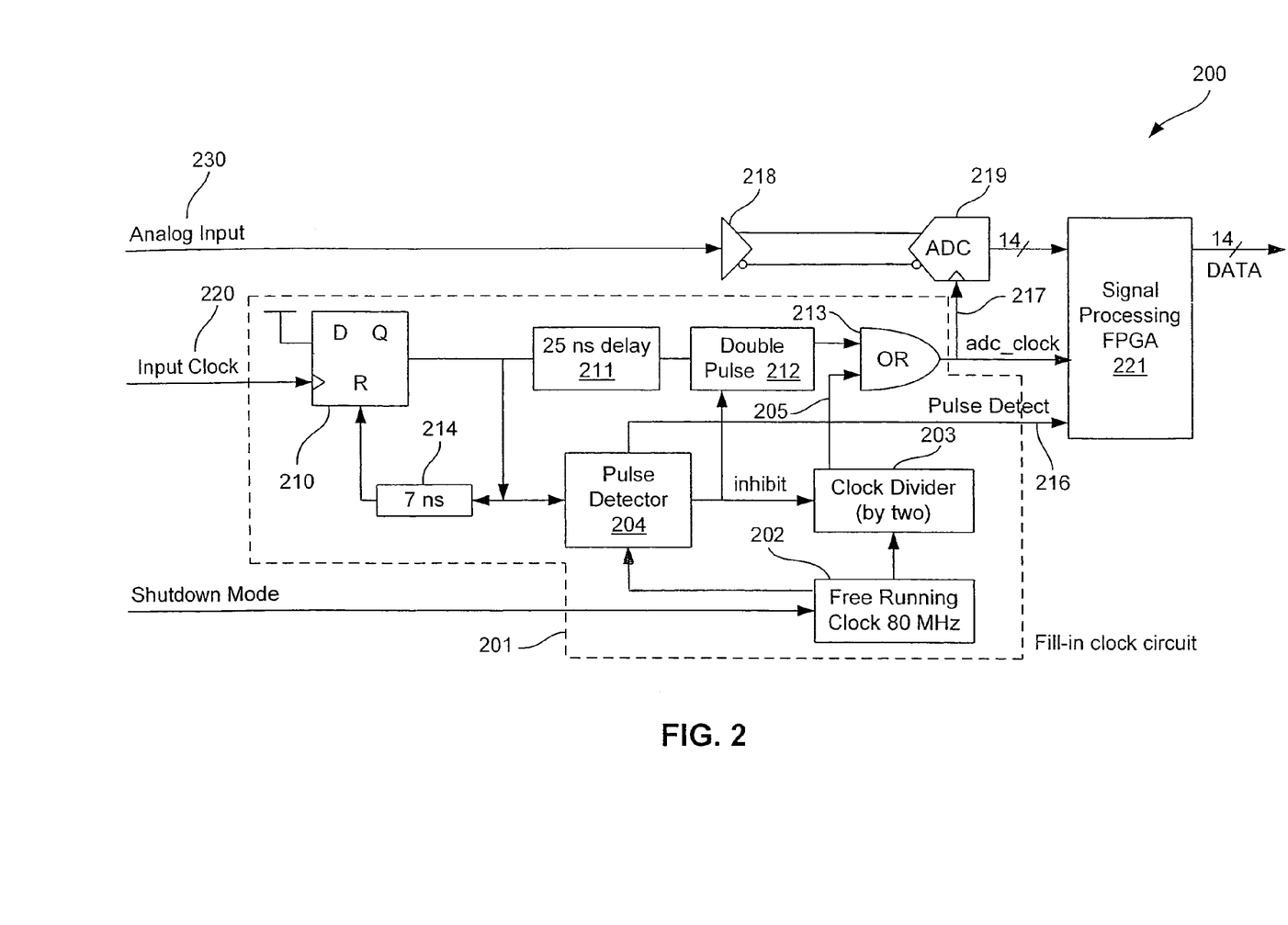
FIG. 2 is a block diagram of the present clock fill-in circuit with an A/D converter

FIG. 2 shows a fill-in circuit 201 suitable to be implemented for use with a 14 bit, 65 Msps analog to digital converter (ADC) 219 according to one embodiment of the present invention. The minimum sample frequency requirement of the A/D converter 219 is 15 Msps. The converter's minimum pulse width requirement is 7 ns. An example of such an ADC is commercially available from Analog Devices, part no. AD6644. The system 200 shown in FIG. 2 allows A/D converter 219 to sample down to DC (direct current) with no restriction on the minimum pulse width; any pulse width and sampling frequency up to 65 Msps can be applied. The system 200 consists of fill-in circuit 201, A/D converter 219, and a signal processing field programmable gate array (FPGA) 221. The analog input signal on line 230 is coupled to differential amplifier 218, which provides the input signal to A/D converter 219. One of skill in the art will understand that the present minimum and maximum sampling frequencies and the minimum pulse widths are requirements of a certain A/D converter and that different requirements may be imposed on the system within the bounds of this invention.

Referring now to FIG. 2, the first flip flop 210 and the delay line 214 of 7 ns act as a pulse stretcher to ensure a minimum pulse width of 7 ns as specified by the ADC 219. The output signal of the delay line 214 drives both the main clock path and a pulse detector circuit 204. The A/D converter 219 is specified to receive its input clock pulses with a minimum frequency of 15 Msps at all times. When there is no input clock pulse, the clock 217 to the A/D converter 219 is filled-in by the 80 MHz oscillator 202 and the divider-by-two 203. One of skill in the art will understand that the oscillator 202 frequency is tailored to the requirements of the A/D converter 219 and may vary accordingly. Any data measured when the A/D converter 219 is clocked by this 40 Msps fill-in clocking has no meaning because there was no request for data acquisition. These data are therefore disregarded by the conventional signal processing field programmable gate array (FPGA) 221. When an actual request to sample data is made to the system 200, the FPGA 221 will also receive both a clock pulse input on line 215 and a pulse detect input on line 216.

As soon as there is a positive edge from the input clock signal, the pulse detector circuit detects it and inhibits the 80 MHz signal from the oscillator 202. This operation is synchronized with the input clock signal and, depending upon where the input clock pulse's positive edge on line 220 occurs within the 80 MHz clock's period, this inhibition may take up to two periods of the 80 MHz oscillator (25 ns). See FIG. 5, where this interval is called time Ts. In order for the input clock pulse to arrive at the A/D converter clock input after the fill-in clock pulse, the input clock pulse 220 is delayed by 25 ns by delay line 211 on its main path toward the A/D converter 219. Double pulse circuit 212 is coupled between the delay 211 and logic gate 213. Once again, the values used here are illustrative of values used with a particular A/D converter as mentioned above.

If no positive edge from the input clock is detected for more than time Tr ns (see Tr in FIG. 5), the fill-in clock circuit signal generator 201 resumes its operation and starts providing the 40 Msps clock signal 205 again.

Figure 3:
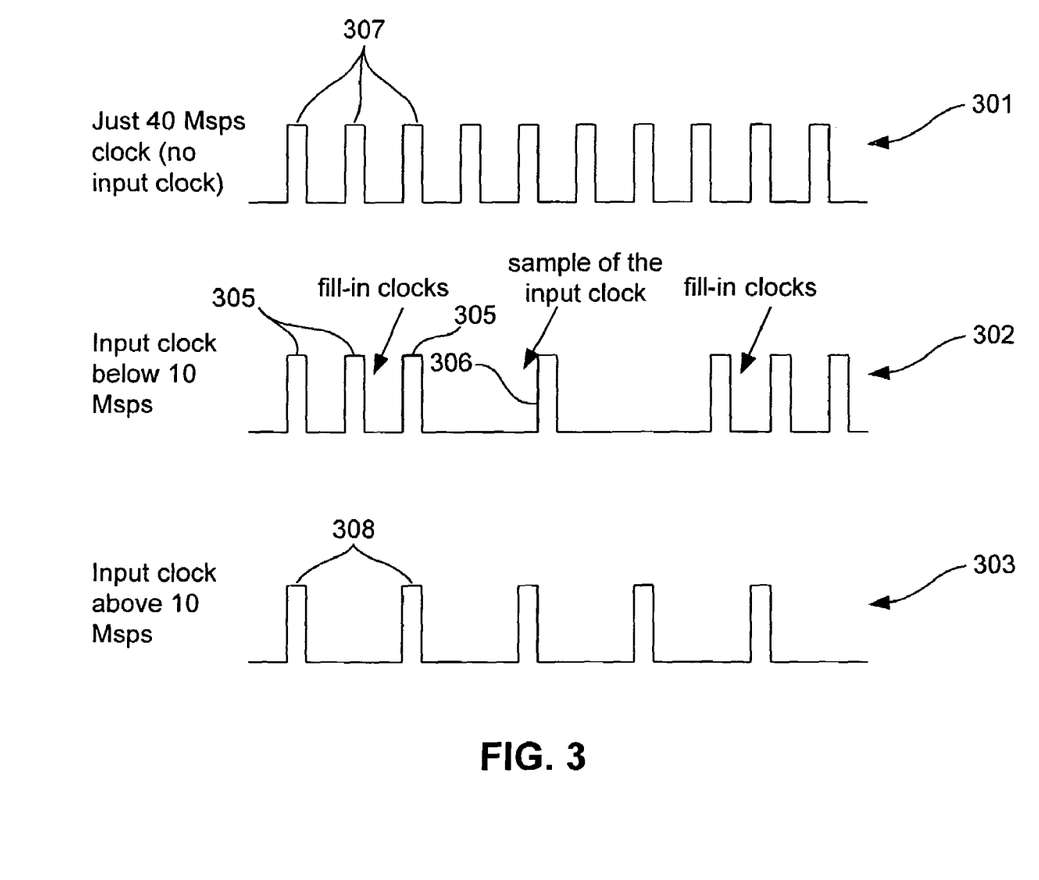
FIG. 3 shows A/D clock timing for different input scenarios

As shown timing diagram FIG. 3, the clock signal to the A/D converter meets one of the three following situations:
continuous 40 Msps fill-in clock pulses 307 when there is no input clock pulse being received at all, as shown in waveform 301.
input clock pulses along with a certain number of fill-in pulses at the rate of 40 Msps in between two input clock pulses' positive edges when the input clock frequency is lower than 15 Msps, as shown in waveform 302. The actual number of these 40 Msps fill-in clock pulses 305 in between actual input clock pulses 306 depends on the input frequency of the actual input clock pulses. The higher the input frequency, the lower the number of these samples in between.
input clock pulses 308 only, when the input frequency is between 15 and 65 Msps, as shown in waveform 303.

Figure 4:
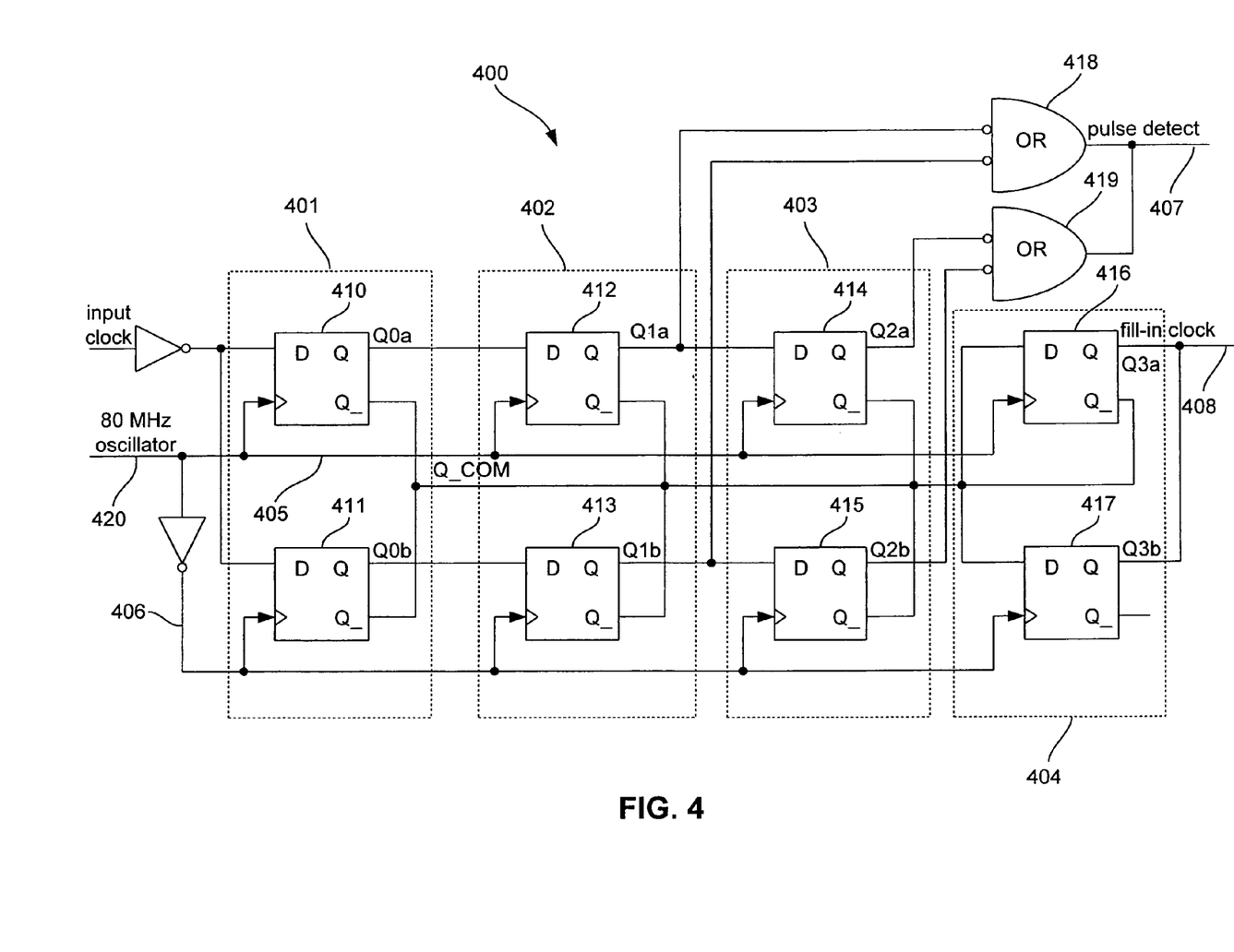
FIG. 4 is a block diagram of the pulse detector and clock divider circuit

FIG. 4 shows how the pulse detector 204 and the clock divider 203 of FIG. 2 are implemented in one embodiment of the present invention. The pulse detector is implemented by the first three flip-flop stages 401, 402, 403 of FIG. 4. Each stage has two flip-flops, one of which is clocked by the positive edge of the clock signal from 80 MHz oscillator on line 405 and the other is clocked by the negative edge on line 406. Flip-flops 410, 412, 414 are clocked by the positive edge of the signal 420 from the 80 MHz clock signal. Flip-flops 411, 413, 415 are clocked by the negative edge of the signal 420 from the 80 MHz clock signal. This prevents any possible metastability condition between the 80 MHz clock signal and the input clock pulse and assures that the input clock pulse is always detected. The output signals from flip flops 412 and 413 are coupled to logic gate 418. The output signals from flip flops 414 and 415 are coupled to logic gate 419. The pulse detect signal on line 407 is high every time that a positive edge of the input clock pulse is detected and stays high until a negative edge of the input clock pulse occurs. This pulse detect signal is then used by the FPGA 221 to track the positive front of the input clock pulse, and FPGA 221 then responds to the input clock pulse as a request for analog data acquisition.

The fill-in clock pulse on line 408 is generated by the divider implemented by the fourth stage flip-flops 416, 417 of stage 404 whose output terminals are connected. Every time that a positive "edge" of the input clock pulse occurs, the signal Q_COM on line 420 becomes high and stays in this state until the next negative front comes (see FIG. 5). This inhibits the fill-in clock signal, which stays high while inhibited. The inverted fill-in clock is coupled to an OR gate 213 along with the input clock signal. In this situation the clock signal pulsing the A/D converter is provided by the input clock pulse.

When either the input clock signal is no longer active (and stays in the quiet low state) or it is below 15 Msps, the 40 Msps clock signal that is coupled to the A/D converter is restored after time Tr. As shown in timing diagram FIG. 5, time Tr (503) has two parts:
a random delay time Tra 501 that depends on how long the inverted input clock signal stays at low level. The input clock period cannot be predicted.
a fixed delay time Tfi 502 that is equal to 4.5 periods of the 80 MHz oscillator (62.5 ns);

Depending upon the requirements of a particular A/D converter, a maximum wait time exists representing the amount of time that can pass between input clock signal pulses to the A/D converter. The maximum wait time represents the largest acceptable time Tr for the A/D converter.

Every input clock pulse's positive edge, which represents a request for analog data acquisition, is followed by a positive edge of the 40 Msps clock signal without a fixed time relationship. In other words, when the input clock signal is sampling below 10 Msps, the A/D converter 219 is sampled by two consecutive positive pulse edges (the edge of the input clock signal followed by the edge of the 40 Msps clock signal) that have a random relationship and are completely asynchronous. The data sampled by the positive edge of the input clock signal is therefore affected by distortion. This is due to the difference in droop of the first stage of the A/D converter 219, which is different for two consecutive sampling pulses if their time relationships are not constant. The droop of the signal is based upon time constants within the A/D converter. A/D converters capable of data sampling at very high frequencies are vulnerable to this distortion.

Figure 6:
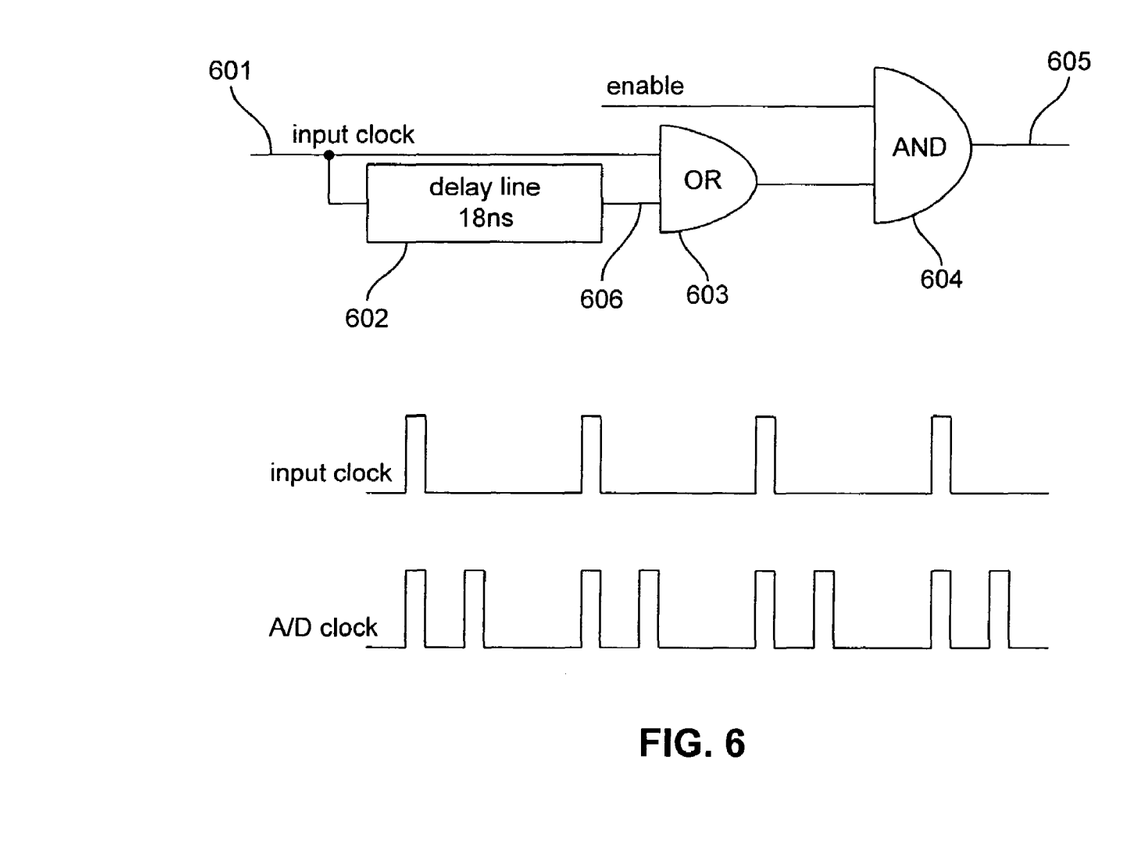

In order to overcome this problem and retain high performance even when sampling below 15 Msps, the double pulse circuit 600 of FIG. 6 is provided. The input clock signal on line 601 is duplicated and generates a signal 606 that has a fixed delay of 18 ns between its two positive edges. Thus, if the second (duplicated) clock pulse is used to trigger a sample used in the A/D converter 219 in a differential operation, for example, the earlier first sample has not suffered degradation due to droop. Different values may used for the delay depending upon the characteristics of the particular A/D 219 used.

Theoretically, since the A/D converter 219 of the embodiment described above has 4 pipe stages, the input clock pulse should be followed by three equally time spaced pulses. However, experiments have shown that two pulses are enough in some applications to enhance the performance and that four pulses would provide any substantial improvement. More pulses may be used, however, in some applications.

Figure 7:
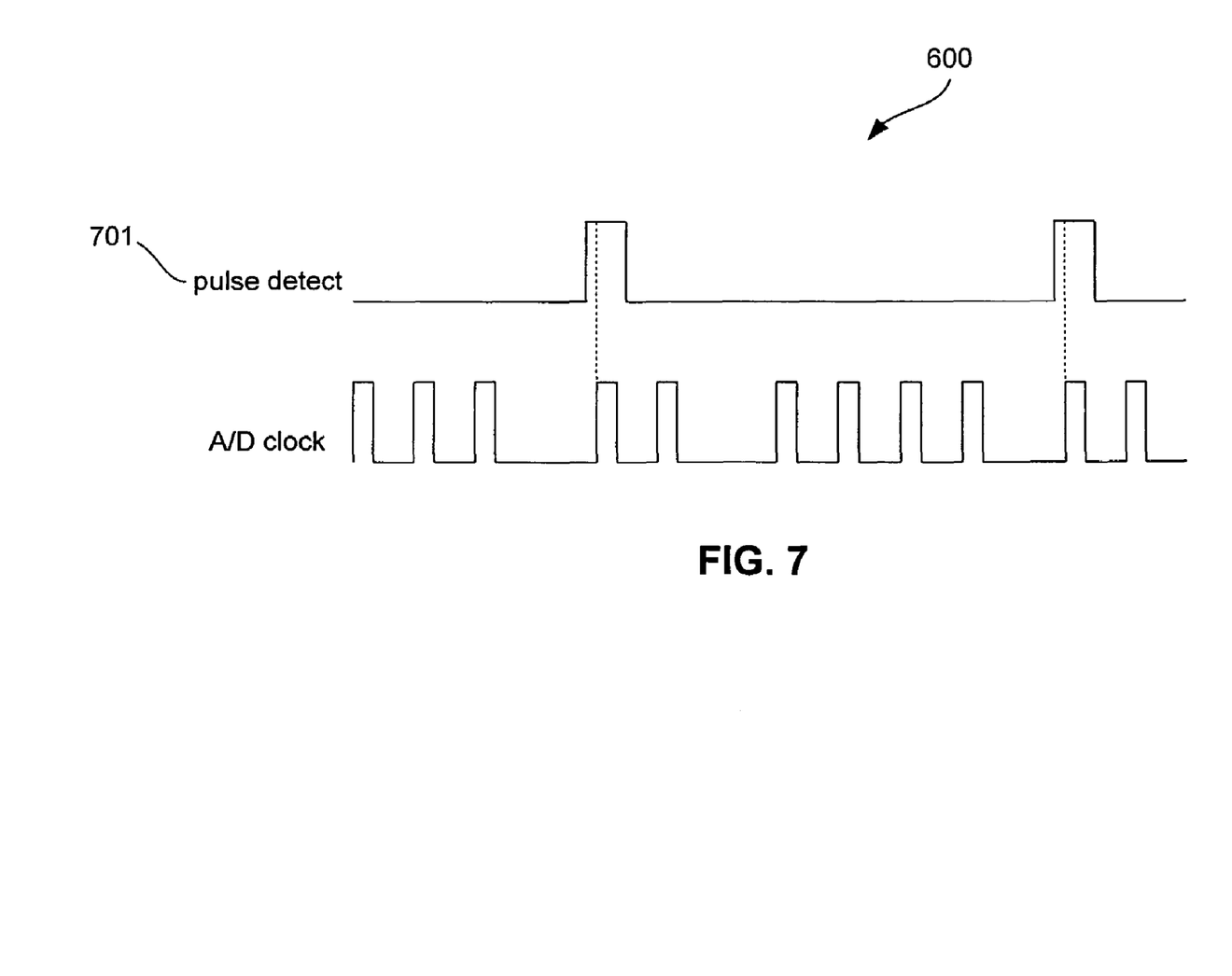
FIG. 7 shows timing for input clock detection

The double pulse circuit 600 of FIG. 6 is implemented by a delay line 602 of 18 ns delay, an OR gate 603 and an AND gate 604 that enables the circuit only below 15 Msps. Clock pulses are received by circuit 600 on signal line 601. The double pulse circuit 600 output signal is on signal line 605. When the A/D converter 219 is being sampled below 15 Msps, fill-in clock pulses are added. Data captured based on these fill-in clock pulses has no meaning from the user perspective and will usually be disregarded. Data requested by the user will have a pulse detect signal associated with it, whereas data captured based on fill-in clocking will not. As also seen in accompanying timing diagram FIG. 7, the pulse detect signal 504, 701 of FIG. 5 becomes high every time there is a positive edge of the input clock and stays high until the negative edge occurs.

This pulse detect signal is used by the FPGA to 221 track the input clock pulse and enable the output data. When a fill-in clock pulse occurs, pulse detect will not be in the high state and therefore the output data will not be issued from FPGA 221. The FPGA 221 may also perform also other tasks such as digital compensation of the analog gain and digital filtering.

Dynamic performance system 200 is also affected by the 80 MHz oscillator 202 and specifically by the presence of undesired intermodulation products generated by the sampling frequency and the oscillator 202. When the A/D converter 219 is being sampled above its minimum sampling frequency of 15 Msps, the fill-in clock circuit and the 80 MHz oscillator 202 are no longer required. Therefore, in this situation, the oscillator 202 can be shutdown. A simple frequency detector circuit processes the input clock and inhibits the oscillator 202 when this condition is detected.

Five different cases of analog input frequency are shown in Table 1. For each input frequency, data are shown for sampling either below or above 15 Msps, which in this case is the exemplary minimum sampling frequency of the A/D converter 219.

TABLE 1

| Fs [MHz] | Fin [MHz] | SFDR [dBc] | SNR [dB] | THD [dB] |
|---|---|---|---|---|
| 10 | 1.022 | 86.111 | 68.752 | −87.528 |
| 20 |  | 90.290 | 68.052 | −88.189 |
| 12.5 | 0.799 | 87.215 | 69.195 | −86.575 |
| 25 |  | 89.312 | 68.472 | −85.928 |
| 8 | 0.511 | 86.549 | 69.372 | −85.242 |
| 16 |  | 88.667 | 68.512 | −85.625 |
| 13.5 | 0.882 | 85.695 | 69.058 | −85.420 |

TABLE 1-continued

| Fs [MHz] | Fin [MHz] | SFDR [dBc] | SNR [dB] | THD [dB] |
|---|---|---|---|---|
| 26 |  | 89.820 | 68.460 | −84.941 |
| 9 | 0.581 | 87.361 | 69.152 | −87.313 |
| 18 |  | 88.749 | 68.555 | −85.445 |

Fs—Data sampling frequency
Fin—Frequency of the analog signal being measured
SFDR—Spurious-Free Dynamic Range
SNR—Signal to Noise ratio
THD—Total Harmonic Distortion When sampling below 15 Msps, the fill-in clock circuit 201 is active and provides fill-in clock pulses between two input clock pulses. When sampling above 15 Msps, the fill-in clock circuit 201 is inhibited and the 80 MHz oscillator 202 is shut down. The harmonics introduced by the A/D converter 219 and its noise floor do not seem to change significantly when sampling below or above 15 Msps. The SFDR, though, is affected. The SFDR is the ratio of the rms signal amplitude to the rms value of the peak spurious spectral component. The peak spurious component may or may not be a harmonic. More spurs are introduced when the fill-in clock circuit 201 is active. The deterioration of the SFDR is between 2 and 4 dB between the two cases.

Most of the spurs are generated by intermodulation products between the sampling frequency and the 80 MHz oscillator. This is why when sampling above 15 Msps the 80 MHz oscillator, which is not required anymore, is shut down. Some spurs could have been generated by the A/D converter itself if the double pulse circuit 600 had not been applied. This would have been due to the fact that the restore time Tr of the fill-in clock signal would not be predictable. The double pulse circuit 600 duplicates the sample of the input clock signal and allows the two input stages of the A/D converter 219 to see a non jittering sampling clock signal. In this case, the restore time only affects the last two stages of the A/D converter 219 that are not the ones that involve the most significant bits.

Table 2 shows detail for the first case of Table 1 (analog input frequency of 1.022 MHz). The SFDR that would be obtained if the double pulse circuit 600 were not active is also shown. This latter case is essentially theoretical.

TABLE 2

| Fs | SFDR | Conditions |
|---|---|---|
| 20 | 90.290 | Shut-down mode |
| 10 | 86.111 | Double pulse circuit active |
| 10 | 82.856 | Double pulse circuit inhibited |

Figure 8:
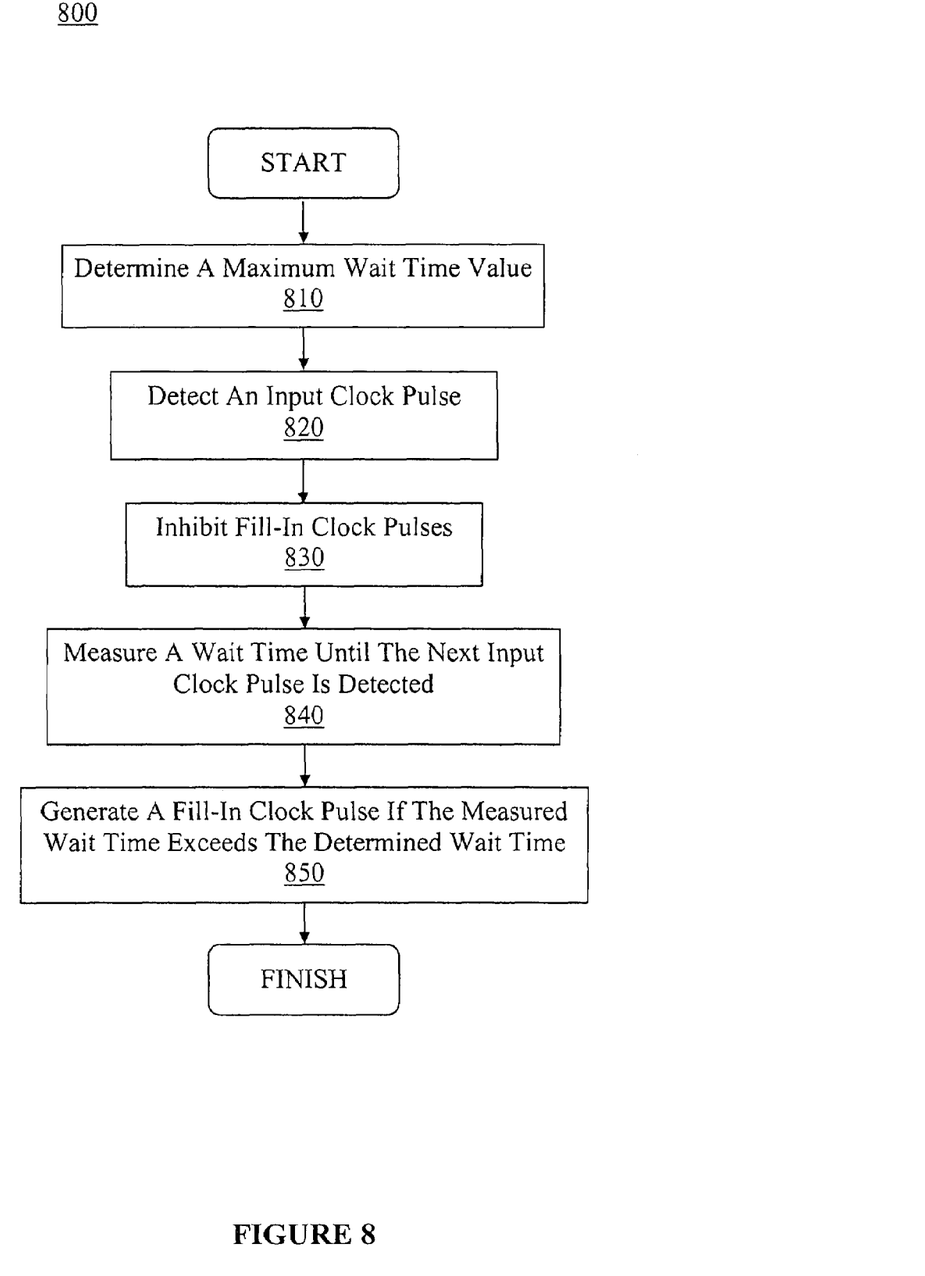
FIG. 8 shows a flowchart for providing input clock pulse and fill-in clock pulse signals to an analog to digital converter.

FIG. 8 shows computer-implemented process 800 for generating fill-in clock pulses for automated test equipment (ATE). As shown in FIG. 8, step 810 involves determining a maximum wait time value. The maximum wait time value may be the amount of time that can pass between input clock signal pulses for an analog-to-digital converter (e.g., 219 of FIG. 2).

Step 820 involves detecting an input clock pulse. The input clock pulse may be sent to a fill-in clock circuit (e.g., 201 of FIG. 2) along a line (e.g., 220) coupled to the fill-in clock circuit. Additionally, the input clock pulse may indicate a request for analog data acquisition.

Figure 5:
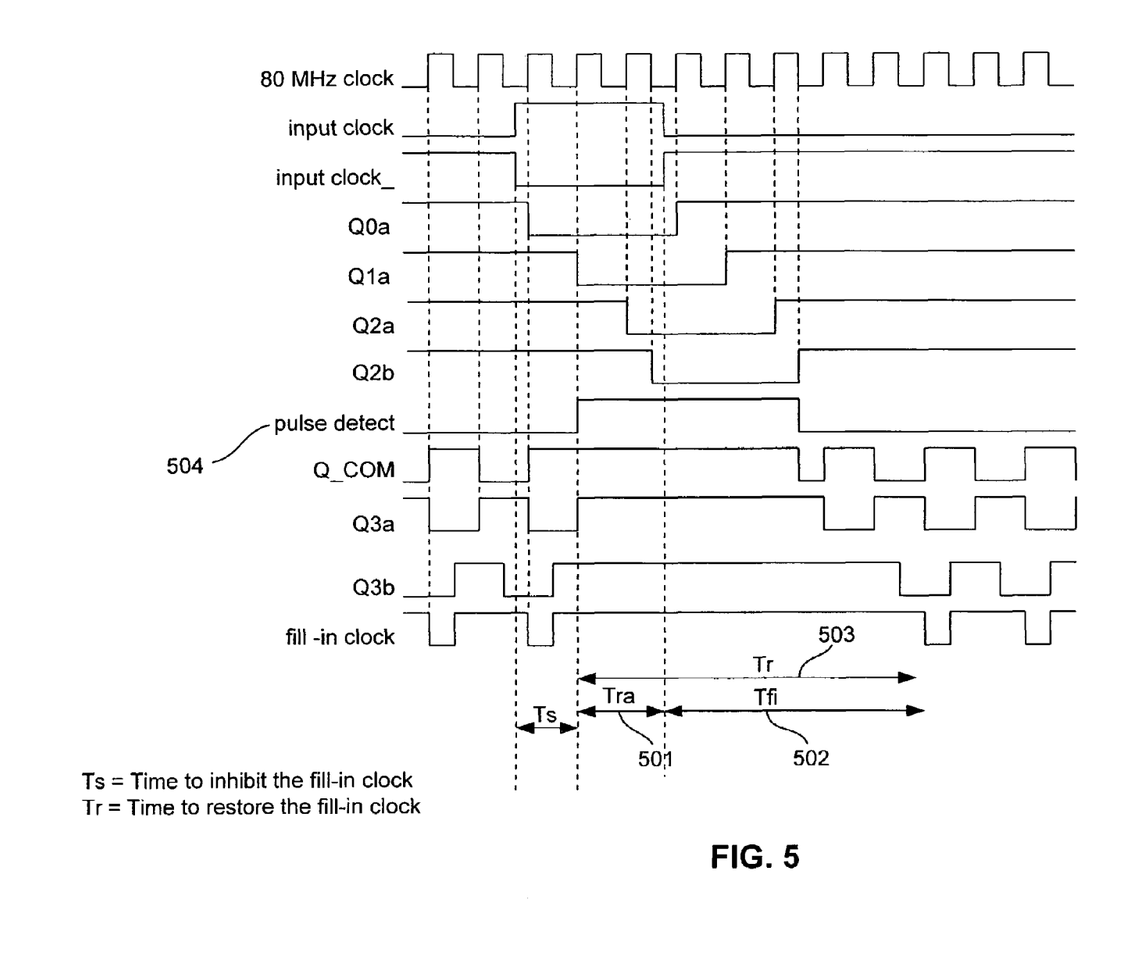
FIG. 5 shows the relative timing of different pulses of the circuit FIG. 6 contains a circuit diagram and timing chart for the double pulse circuit

As shown in FIG. 8, step 830 involves inhibiting fill-in clock pulses. The fill-in clock pulses may be inhibited in response to a detection of an input clock pulse (e.g., in step 820). The inhibiting may be performed by one or more components of a fill-in clock circuit (e.g., clock divider 203, etc. of FIG. 2). Additionally, the inhibiting of fill-in clock pulses may not be instantaneous, and therefore, a period of time (e.g. $T_s$ as shown in FIG. 5) may elapse before the fill-in clock pulses are inhibited.

Step 840 involves measuring a wait time until the next input clock pulse is detected. Thereafter, one or more fill-in clock pulses may be generated in step 850 if the measured wait time exceeds the determined wait time. The generation of fill-in clock pulses may signal the end of a period of time (e.g., $T_r$ as shown in FIG. 5) during which fill-in clock pulses are inhibited. Additionally, the fill-in clock pulses may be initially provided by an oscillator (e.g., 202 of FIG. 2) and further modified by one or more components (e.g., clock divider 203, etc. of FIG. 2) of a fill-in clock circuit (e.g., 201 of FIG. 2) before being fed to an analog-to-digital converter (e.g., 219 of FIG. 2). Additionally, subsequent fill-in clock pulses may be generated (e.g., at predetermined time intervals) and fed to the analog-to-digital converter (e.g., 219 of FIG. 2).

This disclosure is illustrative and not limiting; further modifications will be apparent of this disclosure and are intended to fall within the scope of the appended claims.

What is claimed is:

1. A method for providing signals to a sampler circuit, said method comprising:
   determining a maximum wait time;
   detecting an input clock pulse, wherein said input clock pulse is provided to said sampler circuit;
   measuring a wait time until the next input clock pulse is detected;
   generating a fill-in clock pulse; and
   providing said fill-in clock pulse to said sampler circuit if the measured wait time exceeds the determined maximum wait time.

2. The method of claim 1, wherein said sampler circuit comprises an analog to digital converter.

3. The method of claim 1 further comprising converting an analog signal to a digital signal in response to one of the input clock pulse and the fill-in clock pulse.

4. The method of claim 2 further comprising extending a width of the input clock pulse to a predetermined width.

5. The method of claim 2 wherein said providing said fill-in clock pulse comprises providing said fill-in clock pulse to the analog to digital converter.

6. The method of claim 3, wherein said converting is performed by said sampler circuit, and wherein said sampler circuit comprises a pipeline analog to digital converter.

7. The method of claim 2 further comprising generating additional fill-in clock pulses.

8. The method of claim 4 further comprising generating additional fill-in clock pulses at predetermined time intervals.

9. The method of claim 3 further comprising delaying the input clock pulse prior to said converting the analog signal.

10. The method of claim 1 further comprising delaying the input clock pulse prior to providing the fill-in clock pulse to the sampling circuit.

11. The method of claim 9, wherein a plurality of fill-in clock pulses are provided at least until another input clock pulse is detected to continuously provide clock pulses at a time interval less than the maximum wait time.

12. The method of claim 1, wherein said generating a fill-in clock pulse comprises using an oscillator.

13. The method of claim 12, wherein said oscillator provides an oscillator output signal and said generating further comprises dividing the oscillator output signal.

14. The method of claim 2 further comprising supplying a digital signal converted by the analog to digital converter to a signal processing circuit.

15. The method of claim 14 further comprising transmitting a pulse detect signal to the signal processing circuit in response to receiving an input clock pulse.

16. The method of claim 12 further comprising inhibiting said providing said fill-in clock pulse when the wait time is less than the maximum allowable wait time.

17. The method of claim 1 further comprising providing an additional clock pulse to the sampling circuit in response to the input clock pulse.

18. The method of claim 17 wherein the additional clock pulse succeeds at least one of the input clock pulse and the fill-in clock pulse by a predetermined amount of time.

19. An apparatus comprising:
   a first delay which receives a signal at an input terminal;
   a clock circuit;
   a logic gate;
   a pulse detection circuit coupled between an output terminal of the first delay and the clock circuit;
   a second delay coupled between an output terminal of the first delay and a first input terminal of the logic gate; and
   a clock divider circuit coupled between the pulse detection circuit and the clock circuit;
   wherein the clock divider circuit provides an output signal to a second input terminal of the logic gate.

20. The apparatus of claim 19 wherein the first delay device is a D flip flop.

21. The apparatus of claim 19 wherein the logic gate is an OR gate.

22. The apparatus of claim 19 further comprising a double pulse circuit coupled between the second delay and the logic gate.

23. The apparatus of claim 19 wherein the clock circuit comprises an oscillator.

24. The apparatus of claim 23, wherein the pulse detection circuit comprises:
   a third delay coupled between an output terminal of the first delay and a fourth delay;
   the fourth delay coupled between an output terminal of the third delay and a fifth delay;
   the fifth delay coupled between an output terminal of the fourth delay and a second logic gate;
   a sixth delay coupled between an output terminal of the first delay and a seventh delay;
   the seventh delay coupled between an output terminal of the sixth delay and an eighth delay;
   the eighth delay coupled between an output terminal of the seventh delay and the second logic gate.

25. The apparatus of claim 24 wherein the third, fourth, fifth, sixth, seventh, and eighth delays are D flip-flops.

26. The apparatus of claim 25, further comprising an inverter coupled between the clock circuit and the clock inputs of the sixth, seventh, and eighth delays.

27. The apparatus of claim 24 further comprising a third logic gate, wherein an input terminal of the third logic gate is coupled to the output of the fourth delay, and another input terminal of the third logic gate is coupled to the output of the seventh delay.

28. The apparatus of claim 27 wherein an output terminal of the second logic gate is coupled to an output terminal of the third logic gate.

* * * * *